United States Patent
AbuGhazaleh et al.

(10) Patent No.: US 9,478,888 B2
(45) Date of Patent: *Oct. 25, 2016

(54) ELECTRICAL CONNECTOR WITH LOW-STRESS, REDUCED-ELECTRICAL-LENGTH CONTACTS

(71) Applicant: Hubbell Incorporated, Shelton, CT (US)

(72) Inventors: Shadi Alex AbuGhazaleh, Guilford, CT (US); Joseph Edgar Dupuis, Ledyard, CT (US); Christopher Wayne Gribble, Westerly, RI (US); Naved Shah Khan, Glastonbury, CT (US); Douglas Paul O'Connor, Richmond, RI (US)

(73) Assignee: Hubbell Incorporated, Shelton, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/594,640

(22) Filed: Jan. 12, 2015

(65) Prior Publication Data

US 2015/0126074 A1    May 7, 2015

Related U.S. Application Data

(60) Continuation of application No. 12/929,726, filed on Feb. 11, 2011, now Pat. No. 8,931,167, which is a division of application No. 12/616,905, filed on Nov. 12, 2009, now Pat. No. 7,909,657.

(51) Int. Cl.
*H01R 13/24* (2006.01)
*H05K 3/32* (2006.01)

(Continued)

(52) U.S. Cl.
CPC ...... *H01R 13/2442* (2013.01); *H01R 13/6466* (2013.01); *H01R 24/62* (2013.01); *H01R 24/64* (2013.01); *H01R 43/20* (2013.01); *H01R 43/205* (2013.01); *H05K 3/325* (2013.01); *H01R 13/24* (2013.01); *H01R 13/405* (2013.01);

(Continued)

(58) Field of Classification Search
CPC ............ H01R 23/025; H01R 13/6658; H01R 23/005
See application file for complete search history.

(56) References Cited

U.S. PATENT DOCUMENTS

| | | |
|---|---|---|
| 3,470,522 A | 9/1969 | Lawrence |
| 5,024,610 A | 6/1991 | French et al. |

(Continued)

FOREIGN PATENT DOCUMENTS

| | | |
|---|---|---|
| FR | 2592529 A1 | 7/1987 |
| JP | 3-194869 A | 8/1991 |

*Primary Examiner* — Gary Paumen
(74) *Attorney, Agent, or Firm* — Dickinson Wright PLLC

(57) ABSTRACT

An electrical connector adapted to receive a mating plug utilizes low-profile jack terminal contacts that can flex in their PCB-anchored base portions, which are substantially parallel to the PCB. Any bend in the distal connecting portion or in the intermediate transition portion of each terminal contact is gradual and forms an obtuse angle, thus minimizing stress concentrations. The contacts preferably are arranged in two oppositely facing and interdigitating rows of four contacts each. In one embodiment, the terminal contacts are anchored to the PCB by a contact cradle that constrains the base portion of each terminal contact at two spaced anchoring locations, allowing the base portion to flex therebetween. In another embodiment, the base portions of the terminal contacts are embedded in at least one elastomeric member, which is fitted to the PCB.

35 Claims, 6 Drawing Sheets

(51) Int. Cl.
*H01R 24/64* (2011.01)
*H01R 13/6466* (2011.01)
*H01R 24/62* (2011.01)
*H01R 43/20* (2006.01)
*H01R 13/405* (2006.01)
*H01R 13/66* (2006.01)
*H01R 107/00* (2006.01)
*H05K 1/18* (2006.01)
*H05K 3/40* (2006.01)

(52) U.S. Cl.
CPC ....... *H01R13/6625* (2013.01); *H01R 13/6658* (2013.01); *H01R 2107/00* (2013.01); *H05K 1/182* (2013.01); *H05K 3/4015* (2013.01); *H05K 2201/0133* (2013.01); *H05K 2201/0311* (2013.01); *H05K 2201/1031* (2013.01); *H05K 2201/10424* (2013.01); *H05K 2201/10446* (2013.01); *Y02P 70/611* (2015.11); *Y10S 439/941* (2013.01); *Y10T 29/49147* (2015.01); *Y10T 29/49149* (2015.01); *Y10T 29/49151* (2015.01)

(56) References Cited

U.S. PATENT DOCUMENTS

| | | |
|---|---|---|
| 5,173,055 A | 12/1992 | Grabbe |
| 5,882,230 A | 3/1999 | Bricaud et al. |
| 5,997,358 A | 12/1999 | Adriaenssens et al. |
| 6,086,425 A | 7/2000 | Lescoat |
| 6,120,328 A | 9/2000 | Bricaud et al. |
| 6,180,045 B1 | 1/2001 | Brandenburg et al. |
| 6,350,158 B1 | 2/2002 | Arnett et al. |
| 6,354,891 B1 | 3/2002 | Schnell et al. |
| 6,994,594 B2 | 2/2006 | Milner et al. |
| 7,140,918 B1 | 11/2006 | Delaney et al. |
| 7,153,168 B2 | 12/2006 | Caveney et al. |
| 7,284,324 B2 | 10/2007 | Chua et al. |
| 7,367,849 B2 | 5/2008 | Wang et al. |
| 7,422,493 B2 | 9/2008 | Wang et al. |
| 2003/0091301 A1 | 5/2003 | Lee et al. |
| 2005/0070175 A1 | 3/2005 | Hashimoto |
| 2008/0220666 A1 | 9/2008 | Fedder et al. |
| 2009/0227151 A1 | 9/2009 | Caveney |
| 2010/0062644 A1 | 3/2010 | Aekins et al. |
| 2010/0151707 A1 | 6/2010 | AbuGhazaleh et al. |
| 2014/0342610 A1* | 11/2014 | Hashim ................ H05K 1/0228 439/620.22 |

\* cited by examiner

ELECTRICAL CONNECTOR WITH LOW-STRESS, REDUCED-ELECTRICAL-LENGTH CONTACTS

RELATED APPLICATIONS

This application is a continuation of application Ser. No. 12/929,726, filed on Feb. 11, 2011, and claims the benefit of application Ser. No. 12/616,905, filed on Nov. 12, 2009, now U.S. Pat. No. 7,909,657, the contents of each of which are hereby incorporated by reference in their entirety.

FIELD OF THE INVENTION

The invention relates to electrical connectors, such as modular jacks and plugs used in communication and data transmission systems. Examples include eight-position eight-contact (8P8C) modular jacks commonly used as Ethernet connectors.

BACKGROUND OF THE INVENTION

Near-end crosstalk (NEXT) in communication and data system connectors is an objectionable noise that results from capacitive and/or inductive coupling among the exposed, closely spaced, parallel conductors (contacts) within the jack and/or the mating plug. Crosstalk in a communication or data transmission system degrades the noise margin of the system, resulting in greater error rates in the information conveyed. Typical solutions for reducing near-end crosstalk apply crosstalk compensation signals to the affected jack conductors at particular locations. See, e.g., U.S. Pat. Nos. 5,997,358; 6,350,158; 7,153,168; and 7,367,849, and U.S. patent application Ser. No. 12/314,613, filed Dec. 12, 2008, all of which are incorporated by reference herein in their entireties.

The electrical length of a jack conductor—i.e., the distance between its point of contact with the inserted plug conductor and the point where compensation is applied—is a factor that affects the amount of compensation required. A shorter electrical length translates into more effective compensation up to higher frequencies, requiring less crosstalk compensation. The desired electrical length is less than 0.100 in., preferably closer to 0.060 in. However, the constraints of material and conventional jack geometry have kept the minimum electrical length achievable with traditional spring contact arrangements to greater than 0.130 in. In such arrangements, the jack spring contacts typically project away from the jack's printed circuit board (PCB) at a steep angle, resulting in high stress concentrations at each contact's rigid proximal anchoring point when deflected by an inserted connector plug. Any contact arrangement that would further shorten the electrical length must achieve the desired normal contact forces throughout the required contact deflection range without yielding or breaking due to excessive localized stresses. Solutions that attempt to achieve shorter electrical length involve rather complex arrangements, such as a movable second PCB, e.g., as disclosed in U.S. Pat. No. 7,153,168, or unusually long contacts that engage forward compensation contacts (see U.S. Pat. No. 6,350,158).

Crosstalk amplitude generally increases with higher data transmission rates. Network connectors attached to balanced twisted-pair copper cabling are now expected to meet at least Category 6A performance standards, which require crosstalk levels to be at least 34 dB below the level of the incoming signal at 500 MHz (ANSI/TIA-568-C.2). Demands for even higher data transmission rates are rendering some prior art solutions unsuitable for use in modern networks. A need thus has developed for a low-noise, simple and dependable connector for use in modern communications and data transmission systems.

SUMMARY OF THE INVENTION

The invention utilizes low-profile jack contacts that can flex in their base portions, which are substantially parallel to the PCB. Thus, an electrical connector according to the invention comprises a housing having a plurality of walls and a plug-receiving cavity opening on a front side of the housing. A circuit board in the housing has conductive paths, a plurality of compensation coupling contacts, and one or more compensation elements associated with the compensation coupling contacts. A plurality of resilient, elongated terminal contacts are supported by and extend above the circuit board for making electrical connections with respective wire terminals of an inserted mating connector plug. Each of the elongated terminal contacts is associated with a respective compensation coupling contact and comprises a base portion, a connecting portion and a transition portion interconnecting the base portion and the connecting portion. A majority of the length of the base portion is disposed substantially parallel to the circuit board and is supported thereby for flexural movement. The connecting portion, which makes electrical contact with the respective wire terminal of an inserted connector plug, extends obliquely above the circuit board and has a free end. The transition portion is adapted to make electrical contact with its respective compensation coupling contact, which serves as a fulcrum about which the connecting portion pivots when displaced by the respective wire terminal of an inserted connector plug.

Preferably, any bend in the transition portion or in the connecting portion of each terminal contact is gradual and forms an obtuse angle, thus minimizing stress concentrations. It is also preferred that the transition portion be wider than the connecting portion and the base portion, both of which preferably taper substantially continuously from the transition portion outward. The electrical connector can be configured with any number of terminal contacts arranged in various ways. For example, when the connector is configured with eight terminal contacts, the contacts preferably are arranged in two oppositely facing and interdigitating rows of four contacts each.

In one embodiment, the base portion of each terminal contact is constrained at two spaced constraining locations and is able to flex therebetween. One of the constraining locations preferably is at the compensation coupling contact. Constraint of the terminal contact preferably is effected by a contact cradle above the base portions of the terminal contacts and attached to the circuit board. The contact cradle has a pair of discrete constraining surfaces for each terminal contact that engage the respective terminal contact at the constraining locations, preferably with an opening between the constraining surfaces. The contact cradle also has an aperture for each terminal contact through which the respective connecting portion extends and is able to move during plug insertion and removal.

In another embodiment, instead of constraining the base portions of the terminal contacts at discrete locations, the base portion of each terminal contact is embedded in an elastomeric member that is fixed relative to the circuit board. Preferably, a plurality of terminal contacts are embedded in a common elastomeric member that is fixed relative to the circuit board. It is further preferable to have a plurality of terminal contacts embedded in one common elastomeric member that is fixed relative to the circuit board, and an equal number of terminal contacts embedded another common elastomeric member that is fixed relative to the circuit board. Preferably, the elastomeric members lie substantially in the plane of the circuit board.

A method according to the invention relates to the manner of making the electrical connector of the second embodiment. The method comprises the steps of embedding base portions of a plurality of elongated, resilient terminal contacts in an elastomeric member, leaving free ends of the terminal contacts exposed; fitting the elastomeric member to a circuit board; and installing the circuit board in a connector housing. The embedding step preferably involves arranging the base portions of the terminal contacts parallel to each other. The step of fitting the elastomeric member to the circuit board preferably involves fitting the elastomeric member so that it lies substantially in the plane of the circuit board. Where two sets of terminal contacts are to be separately supported, each set is embedded in a separate elastomeric member, and the two elastomeric members are fitted to the circuit board so that the base portions of all of the terminal contacts are parallel, and the base portions of one set of terminal contacts extend away from the base portions of the other set of terminal contacts, with the free ends of two sets of terminal contacts interdigitating.

BRIEF DESCRIPTION OF THE DRAWINGS

Preferred embodiments of the disclosed invention, including the best mode for carrying out the invention, are described in detail below, purely by way of example, with reference to the accompanying drawing, in which.

DETAILED DESCRIPTION OF THE INVENTION

As used in this application, terms such as "front," "rear," "side," "top," "bottom," "above," "below," "upwardly" and "downwardly" are intended to facilitate the description of the electrical receptacle of the invention, and are not intended to limit the structure of the invention to any particular position or orientation.

Figure 1:
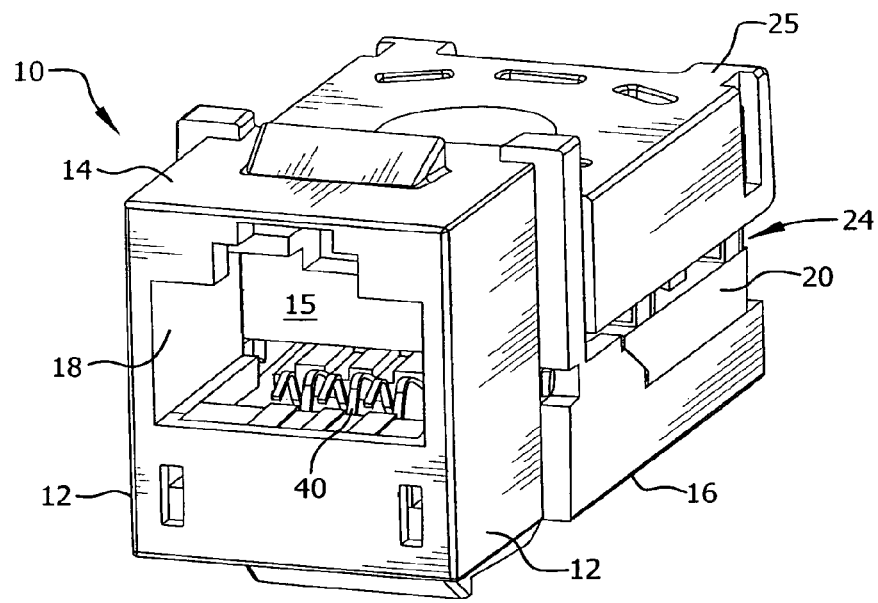
FIG. 1 is a front perspective view of a jack incorporating a PCB and contact assembly according to a first embodiment of the invention.
Figure 2:
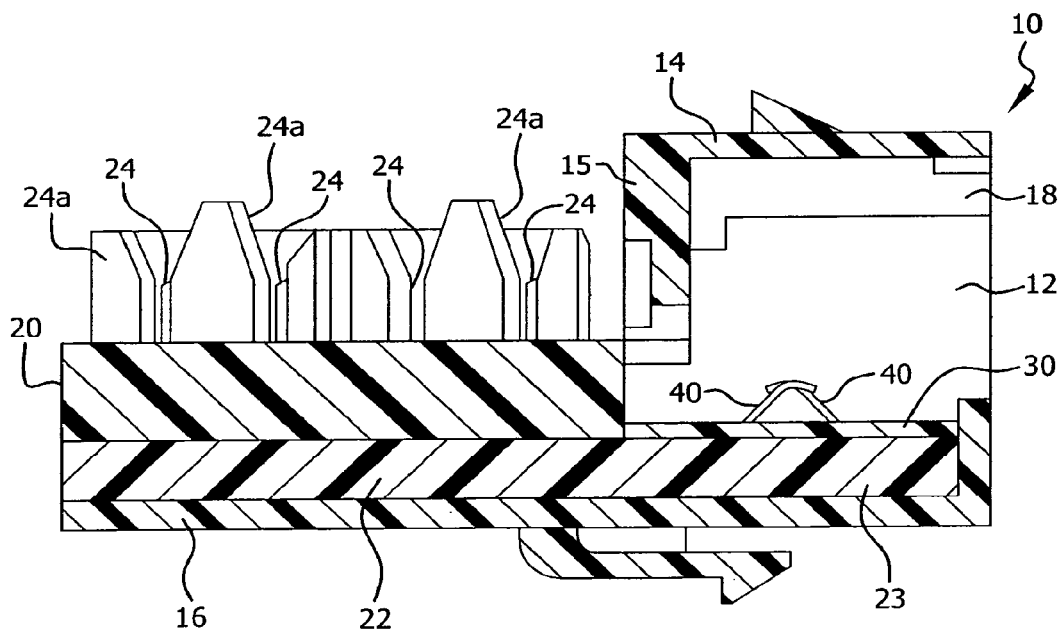
FIG. 2 is a side elevational view in longitudinal cross-section of the jack of FIG. 1, with one part omitted to reveal some features hidden in FIG. 1.

FIGS. 1 and 2 depict a jack that incorporates a first embodiment of a PCB and contact assembly according to the invention. The jack comprises a dielectric housing 10 similar to that disclosed in U.S. Pat. No. 6,994,594, which is incorporated herein by reference in its entirety. The housing has side walls 12, a top wall 14, a rear wall 15, an extended bottom wall 16 and a front-opening plug-receiving cavity 18. A wiring unit 20 is coupled to the housing 10 and includes a printed circuit board (PCB) 22 supported on bottom wall 16, with its narrower front portion 23 extending through an opening in rear wall 15 into the jack interior below cavity 18. Eight wire terminals 24 are mounted on PBC 22 (only four are visible in FIG. 2 among posts 24a). Wire terminals 24 are standard insulation displacement contacts (IDC) to which standard wiring (not shown) can be connected and then secured under a snap-on cover 25, which appears only in FIG. 1. These terminals are electrically connected via conductive traces or paths on the PCB 22 respectively to eight resilient terminal contacts 40, which are held in place on the PCB in two offset rows of four contacts each by a dielectric contact cradle 30 secured to the PCB by adhesive or other suitable means. The preferred material for terminal contacts 40 is beryllium copper (BeCu). Other suitable high-performance alloys may also be used.

Figure 3:
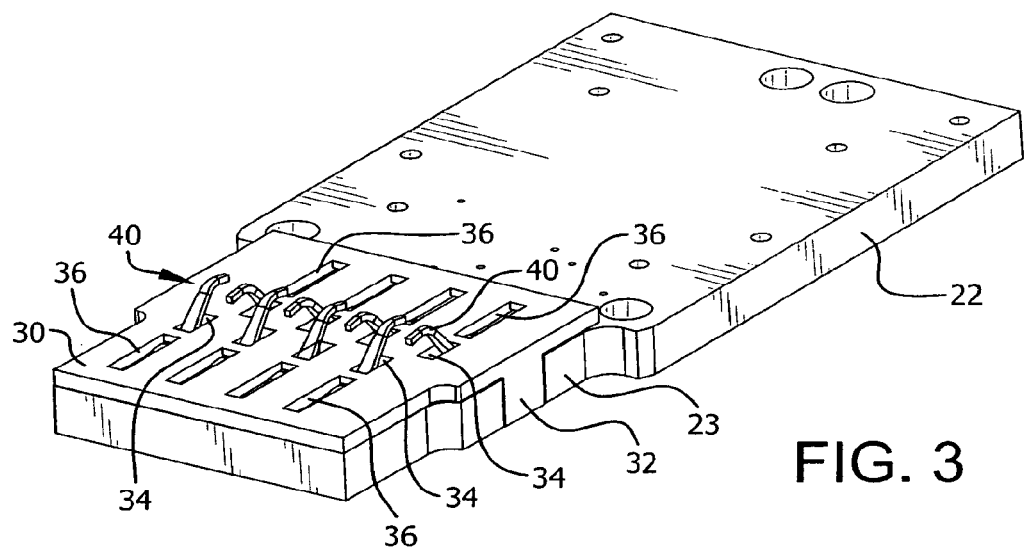
FIG. 3 is a front perspective view of the jack PCB and contact assembly of the first embodiment.
Figure 4:
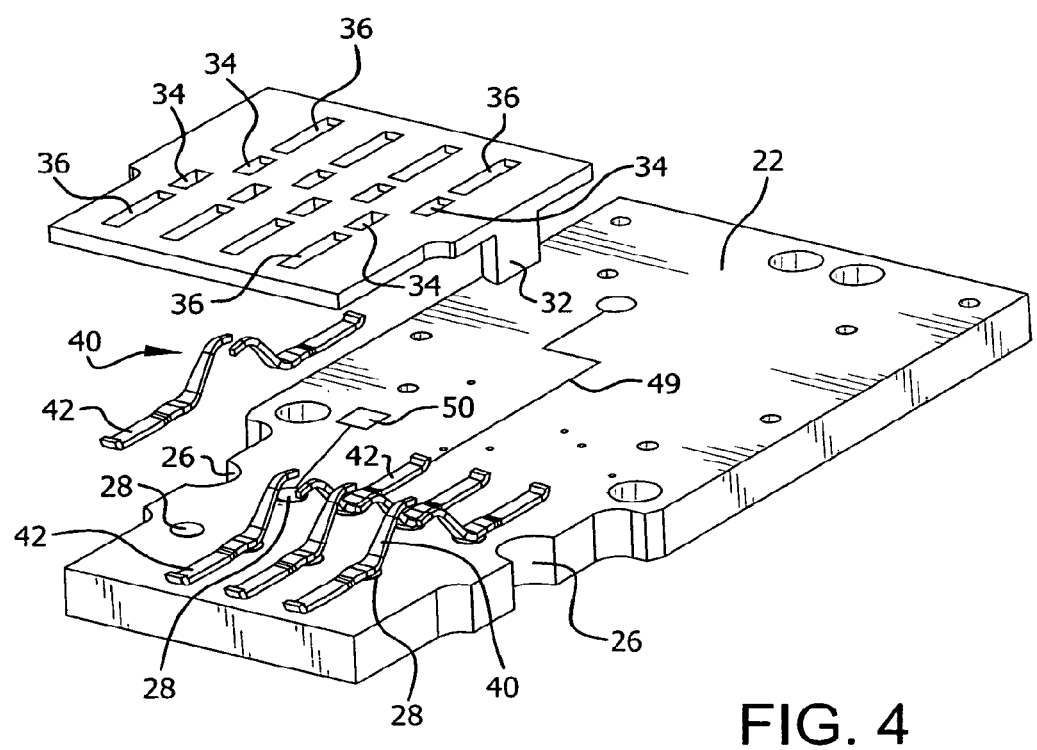
FIG. 4 is an exploded perspective view of the assembly of FIG. 3.

Referring to FIGS. 3 and 4, contact cradle 30 has a profile that matches the narrower front portion 23 of PCB 22, and includes a semi-cylindrical post 32 on each side that mates with a corresponding semi-cylindrical recess 26 on each side of PCB 22. Contact cradle 30 has eight short openings or apertures 34 arranged in two offset rows of four apertures each. A terminal contact 40 extends from the circuit board through each aperture 34, which is dimensioned to allow the terminal contact 40 to move freely during insertion and removal of a mating plug, i.e., without touching the contact cradle. Contact cradle 30 also has eight longer openings 36 arranged in two offset rows of four openings each. These openings are axially aligned with respective apertures 34 and overlie portions of respective terminal contacts 40. Thus, the terminal contacts 40 are arranged in two interdigitating rows of four contacts each.

Figure 5:
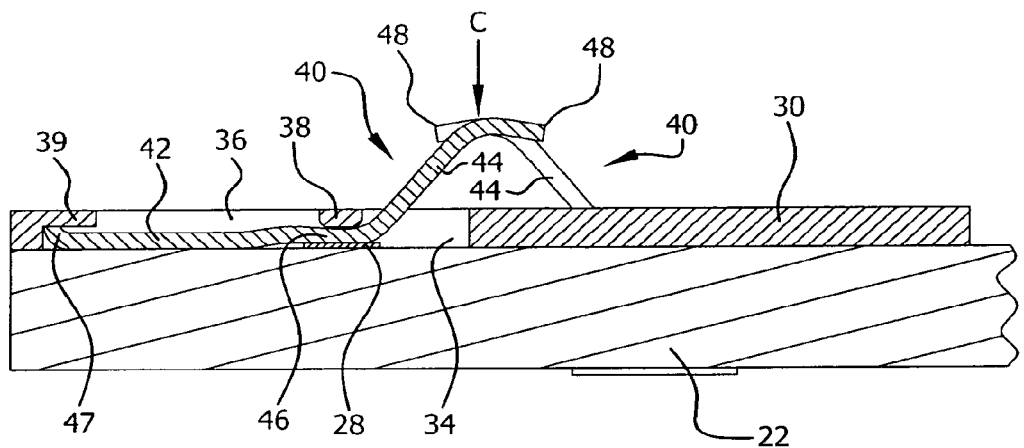
FIG. 5 is a side elevational view in longitudinal cross-section of the assembly of FIG. 3.
Figure 6:
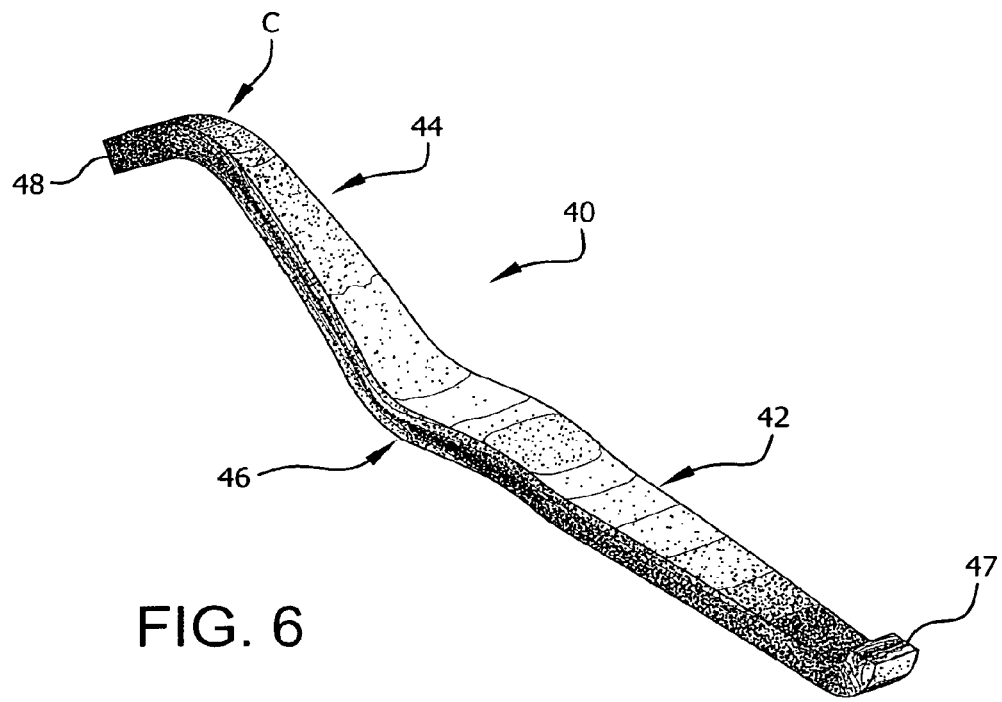
FIG. 6 is a perspective view of a resilient terminal contact used in the assembly of FIG. 3, showing relative stress levels during deflection.
Figure 7:
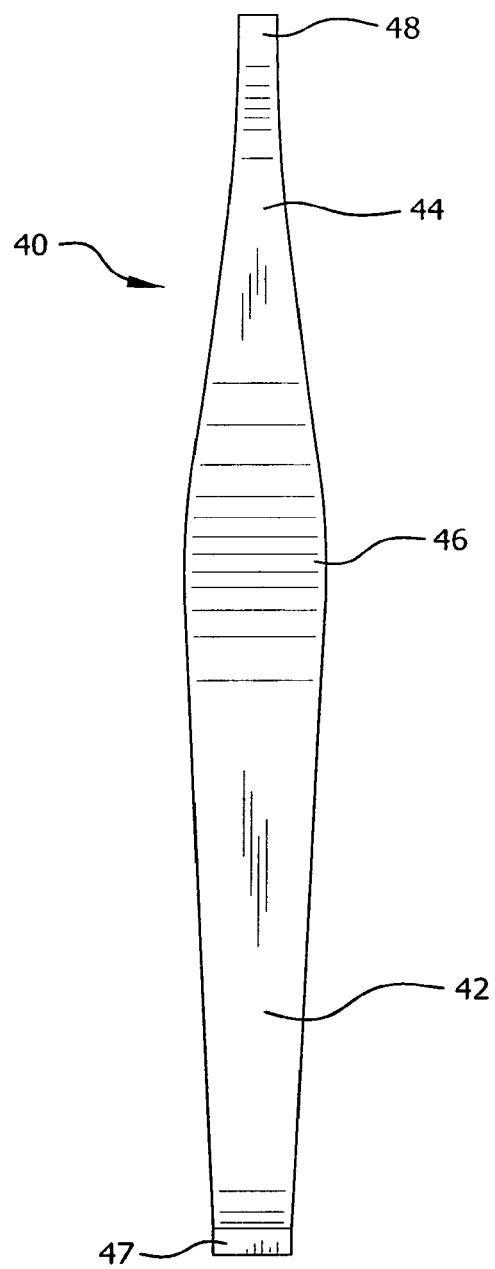
FIG. 7 is a top plan view of a resilient terminal contact used in the assembly of FIG. 3.

Referring to FIGS. 5-7, each terminal contact 40 has a substantially uniform thickness and three portions: a beam-like base portion 42 extending along the PCB; a connecting portion 44 extending obliquely above the PCB through an aperture 34 for making electrical contact with the respective wire terminal of an inserted connector plug; and a transition portion 46 interconnecting the base portion and the connecting portion. Connecting portion 44 is distally curved to form a crest C and an obtuse angle, terminates in a slightly downwardly turned free end 48, and tapers from a wider section adjacent transition portion 46 toward its narrower free end 48. Transition portion 46 is gently curved, forming an obtuse angle where it joins connecting portion 44 and base portion 42. Transition portion 46 also rests on a respective compensation coupling contact 28 of the PCB, where it is constrained against upward movement by an overlying web 38 of the contact cradle between opening 36 and aperture 34. A majority of the length of the base portion 42 lies substantially parallel to the PCB 22. The tail end 47 of the base portion is constrained by a shoulder 39 of the contact cradle at the end of opening 36. Constraining shoulder 39 can be configured to permit limited upward movement of tail end 47 during insertion of a mating plug, or alternatively configured to prevent any upward movement of tail end 47. The base portion 42 makes electrical contact with a respective wire terminal 24 via the PCB conductive traces or paths in a known manner. See FIG. 4, which schematically shows a representative PCB trace 49 extending from one terminal contact 40. Alternatively, the transition portion 46 can communicate electrically with a respective wire terminal 24 via its respective compensation coupling contact 28 and an associated PCB trace 49.

Compensation coupling contact 28 serves as a fulcrum about which the connecting portion 44 of the terminal contact pivots during connector plug insertion and removal. Accordingly, during pivoting motion of the connecting portion 44, the unconstrained section of the base portion 42 (between web 38 and shoulder 39) flexes, thus distributing bending stresses throughout the length of the contact and minimizing stress concentrations. The non-uniform width of the terminal contact 40, depicted in FIG. 7, results in controlled bending and also contributes to proper distribution of bending stresses. Transition portion 46, which is the widest and overlies fulcrum 28, flexes the least. Base portion 42 tapers substantially continuously from there to its tail end 47, which is about half the width of transition portion 46. Connecting portion 44 tapers substantially continuously from transition portion 46 toward the even narrower free end 48. Relative stress levels during deflection are depicted in FIG. 6: Lighter shading represents higher stress; darker shading represents lower stress. This distribution of stresses allows for proper generation of normal contact force between the mating conductors, while reducing permanent contact set and the potential for contact failure.

Compensation (e.g., capacitive) elements 50 on or in the PCB (only one representative element 50 is schematically shown in FIG. 4) communicate with respective compensation coupling contacts 28. The electrical connection between the transition portion 44 and the compensation coupling contact 28 enables the application of a crosstalk compensation signal to the terminal contact 40 at its fulcrum point. This location is a very short distance—on the order of about 0.080 in.—from the crest C of the connecting portion 44, where the electrical interface (point of contact) forms between the terminal contact 40 and the wire terminal of a fully inserted conductor plug. Accordingly, the amount of compensation required to counteract objectionable crosstalk is minimized, resulting in improved electrical performance.

Figure 8:
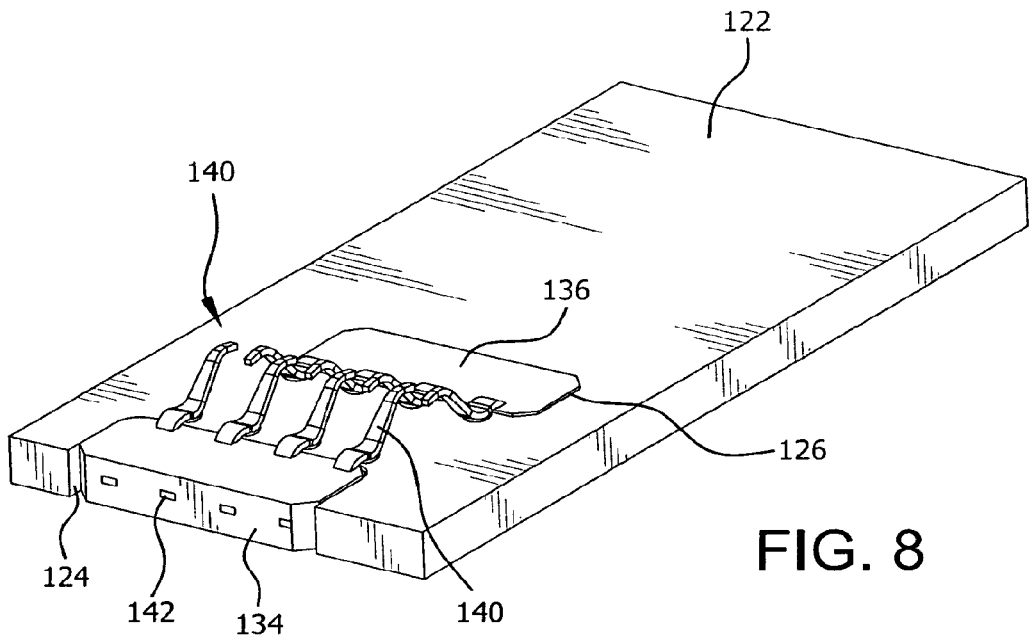
FIG. 8 is a partial front perspective view of a jack PCB and contact assembly according to a second embodiment of the invention.
Figure 9:
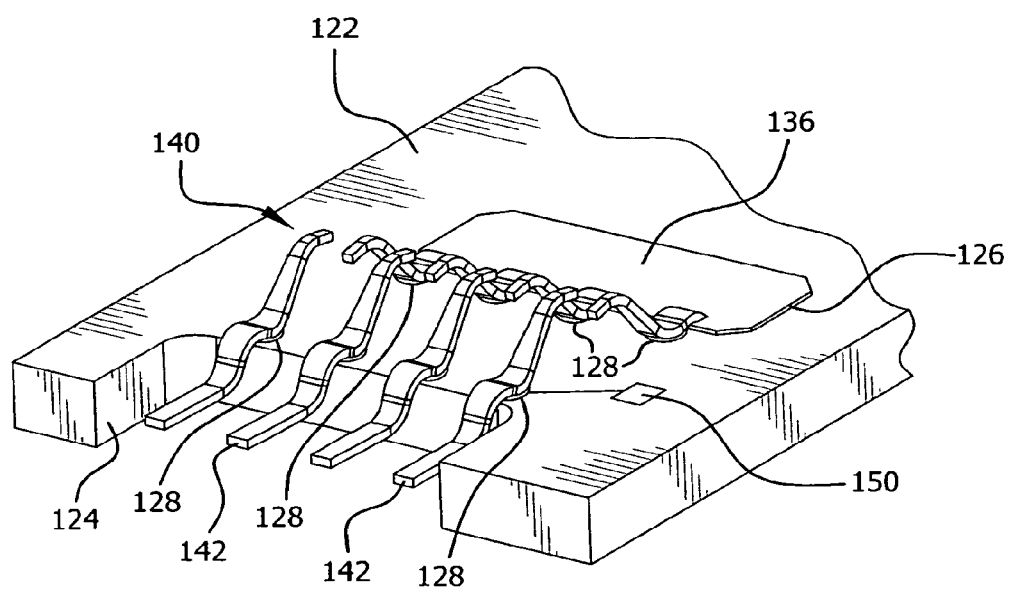
FIG. 9 is a front perspective view similar to FIG. 8, with one part omitted to reveal some features hidden in FIG. 8.
Figure 10:
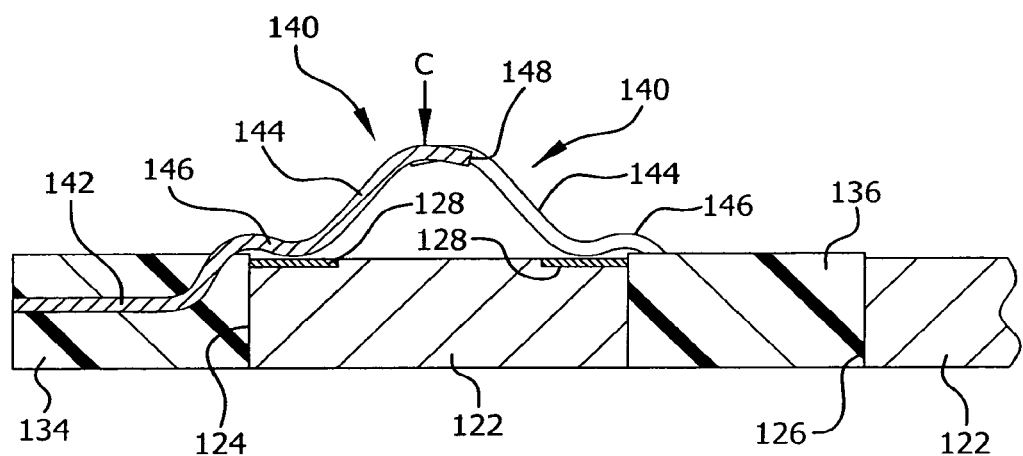
FIG. 10 is a side elevational view in longitudinal cross-section of the assembly of FIG. 8.

The embodiment of FIGS. 8-10 incorporates a somewhat different contact anchoring system to achieve substantially the same improved electrical performance in a reliable jack connector. In this embodiment, the jack housing 10 is the same as that illustrated in FIG. 2; the wiring unit 20 includes the same wire terminals 24 mounted on a PCB; and the resilient terminal contacts are arranged in two interdigitating rows of four contacts each. However, the PCB 122 does not have a contact cradle attached to it. Instead, the two rows of contacts 140 are fixed relative to the PCB by two elastomeric members 134, 136, which are fitted to the PCB (e.g., bonded) in mating openings 124, 126 substantially in the plane of the PCB. The entire length of the connecting portion 144 of each terminal contact is exposed above the PCB. The elastomeric members 134, 136 preferably are made of neoprene (poly-chloroprene) having a durometer hardness of about 40 (Shore A). Other synthetic or natural rubber materials would also be suitable.

As in the first embodiment, the connecting portion 144 of each terminal contact 140 tapers toward its free end 148, is distally curved to form a crest C and an obtuse angle, and terminates in a slightly downwardly turned free end 148. The straight base portion 142 is narrower than the transition portion 146 and is embedded in the elastomeric member 134 (or 136). The transition portion 146 makes electrical contact with a respective wire terminal 24 via its respective compensation coupling contact 128 and an associated PCB conductive trace or path (not shown) in a known manner. The transition portion 146 of this embodiment has two gentle reverse bends forming obtuse angles. One bend overlies a respective compensation coupling contact 128 on the PCB, which also communicates with a respective compensation element 150 (only one representative element 150 is schematically shown in FIG. 9). As illustrated in FIG. 10, the terminal contacts 140 in their relaxed (undeflected) state are spaced from the compensation coupling contacts 128, and make an electrical connection with those contacts only when the terminal contacts deflect upon insertion of a mating plug. It is also possible to configure the assembly such that the terminal contacts 140 always engage the compensation coupling contacts 128.

Assembly of the jack of the second embodiment involves first embedding the terminal contacts 140, in their proper parallel positions, in the elastomeric members 134, 136, leaving the connecting portions 144 exposed. The elastomeric members are then fitted to the PCB 122 in openings 124, 126. Fitting of the elastomeric members may involve, for example, bonding the elastomeric members to the PCB and/or engaging mating structures (e.g., ribs and grooves) on the elastomeric members and in the openings 124, 126. The assembled PCB is then installed in the jack housing 10.

The eight-position eight-contact (8P8C) jacks of the above two embodiments have been chosen as examples that illustrate the principles of the invention. It should be understood by those skilled in the art that the invention can encompass jacks having a different number and/or arrangement of contacts, and that other changes and modifications may be made without departing from the scope of the invention as defined by the appended claims.

What is claimed is:

1. An electrical connector, comprising:
   a housing having a plurality of walls and a plug-receiving cavity opening on a front side of the housing;
   a circuit board in the housing having conductive paths, a plurality of compensation coupling contacts, and one or more compensation elements associated with the compensation coupling contacts; and
   a plurality of elongated resilient terminal contacts supported by and extending above the circuit board for making electrical connections with respective wire terminals of a mating connector plug when inserted into the plug-receiving cavity, each of the terminal contacts being associated with a respective compensation coupling contact and including:
   a base portion with a majority of the length thereof disposed substantially parallel to the circuit board and supported thereby for flexural movement;
   a connecting portion extending obliquely above the circuit board for making electrical contact with the respective wire terminal of an inserted connector plug, the connecting portion having a free end; and
   a transition portion joining the base portion and the connecting portion, the transition portion making electrical contact with the respective compensation coupling contact serving as a fulcrum for flexure of the terminal contact in the base portion, the transition portion and the connecting portion when displaced by the respective wire terminal of an inserted connector plug.

2. An electrical connector according to claim 1, wherein any bend in the transition portion or in the connecting portion of each terminal contact is gradual and forms an obtuse angle.

3. An electrical connector according to claim 2, wherein the transition portion of each terminal contact is wider than the connecting portion and the base portion thereof.

4. An electrical connector according to claim 3, wherein the connecting portion and the transition portion of each terminal contact taper substantially continuously from the transition portion outward.

5. An electrical connector according to claim 1, wherein the transition portion of each terminal contact is wider than the connecting portion and the base portion thereof.

6. An electrical connector according to claim 5, wherein the connecting portion and the transition portion of each terminal contact taper substantially continuously from the transition portion outward.

7. An electrical connector according to claim 1, comprising eight terminal contacts arranged in two oppositely facing and interdigitating rows of four terminal contacts each.

8. An electrical connector according to claim 1, wherein the base portion of each terminal contact is constrained at two spaced constraining locations and is able to flex therebetween.

9. An electrical connector according to claim 8, wherein one of the constraining locations is at the compensation coupling contact.

10. An electrical connector according to claim 9, wherein the transition portion of each terminal contact is wider than the connecting portion and the base portion thereof.

11. An electrical connector according to claim 10, wherein the connecting portion and the transition portion of each terminal contact taper substantially continuously from the transition portion outward.

12. An electrical connector according to claim 8, wherein the base portion is unconstrained between the constraining locations.

13. An electrical connector according to claim 8, wherein a contact cradle is above the base portions of the terminal contacts and is attached to the circuit board, the contact cradle having a pair of discrete constraining surfaces for each terminal contact that engage the respective terminal contact at the constraining locations.

14. An electrical connector according to claim 13, wherein the contact cradle has an opening between each pair of constraining surfaces.

15. An electrical connector according to claim 13, wherein the contact cradle has an aperture for each terminal contact through which the respective connecting portion extends and is able to move during insertion and removal of a connector plug.

16. An electrical connector according to claim 15, wherein the free end of each connecting portion is disposed above the contact cradle.

17. An electrical connector according to claim 16, wherein any bend in the transition portion or in the connecting portion of each terminal contact is gradual and forms an obtuse angle.

18. An electrical connector according to claim 17, comprising eight terminal contacts arranged in two oppositely facing and interdigitating rows of four terminal contacts each.

19. An electrical connector according to claim 1, wherein the base portion of each terminal contact is embedded in an elastomeric member that is fixed relative to the circuit board.

20. An electrical connector according to claim 19, wherein the transition portion of each terminal contact is wider than the connecting portion and the base portion thereof.

21. An electrical connector according to claim 19, wherein a plurality of terminal contacts are embedded in a common elastomeric member that is fixed relative to the circuit board.

22. An electrical connector according to claim 21, wherein a plurality of terminal contacts are embedded in one common elastomeric member that is fixed relative to the circuit board, and an equal number of terminal contacts are embedded in another common elastomeric member that is fixed relative to the circuit board.

23. An electrical connector according to claim 22, wherein the elastomeric members lie substantially in a plane of the circuit board.

24. An electrical connector according to claim 23, wherein any bend in the transition portion or in the connecting portion of each terminal contact is gradual and forms an obtuse angle.

25. An electrical connector according to claim 24, comprising eight terminal contacts arranged in two oppositely facing and interdigitating rows of four terminal contacts each.

26. An electrical connector according to claim 1, wherein the connecting portion comprises a crest for contacting the respective wire terminal, and wherein an electrical length between said compensation coupling contact and said crest is less than 0.1 inches.

27. An electrical connector according to claim 1, wherein a gap is formed between said terminal contact and said compensation contact when said terminal contact is unflexed.

28. An electrical connector, comprising:
a housing having a plurality of walls and a plug-receiving cavity opening on a front side of the housing;
a circuit board in the housing having conductive paths, eight compensation coupling contacts, and one or more compensation elements associated with the compensation coupling contacts;
eight elongated resilient terminal contacts supported by and extending above the circuit board for making electrical connections with respective wire terminals of a mating connector plug when inserted into the plug-receiving cavity, the terminal contacts being arranged in two oppositely facing and interdigitating rows of four terminal contacts each, each of the terminal contacts being associated with a respective compensation coupling contact and including:
a base portion with a majority of the length thereof disposed substantially parallel to the circuit board and supported thereby for flexural movement;
a connecting portion extending obliquely above the circuit board for making electrical contact with the respective wire terminal of an inserted connector plug, the connecting portion having a free end; and
a transition portion joining the base portion and the connecting portion and in electrical contact with the respective compensation coupling contact, which serves as a fulcrum for flexure of the terminal contact in the base portion, the transition portion and the connecting portion when displaced by the respective wire terminal of an inserted connector plug,
wherein any bend in the transition portion or in the connecting portion is gradual and forms an obtuse angle; and a contact cradle attached to the circuit board and including:
eight pairs of discrete constraining surfaces, each pair disposed above and contacting the base portion of a respective terminal contact, one constraining surface of each pair constraining the respective base portion against the respective compensation coupling contact, and the other constraining surface of each pair constraining a tail end of the base portion, the base portion of each terminal contact being unconstrained and allowed to flex between the two constraining surfaces; and
eight apertures, one for each terminal contact, through which the connecting portions of the terminal contacts extend with their free ends disposed above the contact cradle, and in which the connecting portions are able to move during insertion and removal of a connector plug.

29. An electrical connector according to claim 28, wherein the connecting portions comprise a crest for contacting the respective wire terminal, and wherein an electrical length between said compensation coupling contact and said crest is less than 0.1 inches.

30. An electrical connector according to claim 28, wherein the transition portion of each terminal contact is wider than the connecting portion and the base portion thereof, and the connecting portion and the transition portion taper substantially continuously from the transition portion outward.

31. An electrical connector according to claim 28, wherein a gap is formed between said terminal contacts and said compensation contacts when said terminal contacts are unflexed.

32. An electrical connector, comprising:
a housing having a plurality of walls and a plug-receiving cavity opening on a front side of the housing;
a circuit board in the housing having conductive paths, eight compensation coupling contacts, one or more compensation elements associated with the compensation coupling contacts, and a pair of spaced elastomeric members substantially in a plane of the circuit board;
eight elongated resilient terminal contacts supported by the elastomeric members and extending above the circuit board for making electrical connections with respective wire terminals of a mating connector plug when inserted into the plug-receiving cavity, the terminal contacts being arranged in two oppositely facing and interdigitating rows of four terminal contacts each, each row of terminal contacts being supported by a respective elastomeric member, and each of the terminal contacts being associated with a respective compensation coupling contact and including:
a base portion embedded in its respective elastomeric member and able to flex therein, a majority of the length of the base portion being disposed substantially parallel to the circuit board;
a connecting portion extending obliquely above the circuit board for making electrical contact with the respective wire terminal of an inserted connector plug, the connecting portion having a free end; and
a transition portion joining the base portion and the connecting portion and disposed above its respective compensation coupling contact, which electrically contacts the connecting portion and serves as a fulcrum for flexure of the terminal contact in the base portion, the transition portion and the connecting portion when displaced by the respective wire terminal of an inserted connector plug,
wherein any bend in the transition portion or in the connecting portion is gradual and forms an obtuse angle.

33. An electrical connector according to claim 32, wherein the transition portion of each terminal contact is wider than the connecting portion and the base portion thereof.

34. An electrical connector according to claim 32, wherein the connecting portions comprise a crest for contacting the respective wire terminal, and wherein an electrical length between said compensation coupling contact and said crest is less than 0.1 inches.

35. A method of making an electrical connector, comprising:
installing a circuit board within a housing, the housing having a plurality of walls and a plug-receiving cavity opening on a front side of the housing;
attaching a plurality of elongated resilient terminal contacts to the circuit board, the terminal contacts supported by and extending above the circuit board for making electrical connections with respective wire terminal of a mating connector plug when inserted into the plug-receiving cavity;
associating each of the terminal contacts with a respective compensation coupling contact;
forming the terminal contacts to comprise:
a base portion with a portion of the length thereof disposed substantially parallel to the circuit board and supported thereby for flexural movement;
a connecting portion extending obliquely above the circuit board for making electrical contact with the respective wire terminal of an inserted connector plug, the connecting portion having a free end; and
a transition portion joining the base portion and the connecting portion, the transition portion making electrical contact with the respective compensation coupling contact;
flexing the terminal contact in the base portion, the transition portion and the connecting portion when displaced by the respective wire terminal of an inserted connector plug.

\* \* \* \* \*